(12) United States Patent
Bai

(10) Patent No.: US 10,749,145 B2
(45) Date of Patent: Aug. 18, 2020

(54) SCREEN PLATE, PACKAGING METHOD, DISPLAY PANEL AND DISPLAY DEVICE

(71) Applicants: ORDOS YUANSHENG OPTOELECTRONICS CO., LTD., Ordos, Inner Mongolia (CN); BOE TECHNOLOGY GROUP CO., LTD., Beijing (CN)

(72) Inventor: Xuefei Bai, Beijing (CN)

(73) Assignees: ORDOS YUANGSHENG OPTOELECTRONICS CO., LTD., Ordos, Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/335,905

(22) PCT Filed: May 31, 2018

(86) PCT No.: PCT/CN2018/089217
§ 371 (c)(1),
(2) Date: Mar. 22, 2019

(87) PCT Pub. No.: WO2019/024591
PCT Pub. Date: Feb. 7, 2019

(65) Prior Publication Data
US 2019/0267577 A1 Aug. 29, 2019

(30) Foreign Application Priority Data
Aug. 1, 2017 (CN) .......................... 2017 1 0646231

(51) Int. Cl.
*H01L 21/67* (2006.01)
*H01L 51/56* (2006.01)
(Continued)

(52) U.S. Cl.
CPC ........ *H01L 51/56* (2013.01); *H01L 21/67011* (2013.01); *H01L 23/492* (2013.01);
(Continued)

(58) Field of Classification Search
CPC .............................. H01L 21/70; H01L 27/281
See application file for complete search history.

(56) References Cited

U.S. PATENT DOCUMENTS

2005/0269926 A1    12/2005  Fukuoka et al.
2017/0001430 A1*    1/2017  Shibusawa ................ G03F 7/00
(Continued)

FOREIGN PATENT DOCUMENTS

| CN | 100438122 C | 11/2008 |
| CN | 102854666 A | 1/2013 |
| 2017/0207409 | A1 | 7/2017 Li |
| 2017/0271615 | A1 | 9/2017 Xu |
| 2018/0102504 | A1 | 4/2018 Liu |

OTHER PUBLICATIONS

First Office Action for Chinese Application No. 201710646231.3, dated Oct. 8, 2018, 10 Pages.
(Continued)

*Primary Examiner* — Cheung Lee
(74) *Attorney, Agent, or Firm* — Brooks Kushman P.C.

(57) ABSTRACT

A screen plate, a packaging method, a display panel and a display device are provided. The screen plate includes a frame, a mesh fixed onto the frame and a masking film arranged on the mesh. A printing area is formed in a portion of the mesh that is not masked by the masking film. At least one masking line is arranged in the printing area. The at least one masking line is arranged along an edge of the masking film respectively. A width of the masking line is greater than a width of each mesh line of the mesh.

19 Claims, 3 Drawing Sheets

(51) Int. Cl.
  *H01L 51/52* (2006.01)
  *H05K 5/00* (2006.01)
  *H01L 27/32* (2006.01)
  *H01L 23/492* (2006.01)
(52) U.S. Cl.
  CPC .............. *H01L 27/32* (2013.01); *H01L 51/52* (2013.01); *H01L 51/5237* (2013.01); *H01L 51/5246* (2013.01); *H05K 5/0017* (2013.01)

(56) References Cited

FOREIGN PATENT DOCUMENTS

| | | |
|---|---|---|
| CN | 104290433 A | 1/2015 |
| CN | 204278722 U | 4/2015 |
| CN | 104966726 A | 10/2015 |
| CN | 105058957 A | 11/2015 |
| CN | 105682926 A | 6/2016 |
| CN | 105810849 A | 7/2016 |
| CN | 106876428 A | 6/2017 |
| CN | 107507923 A | 12/2017 |
| JP | H0691840 A | 4/1994 |
| JP | H07309076 A | 11/1995 |
| JP | 2001239767 A | 9/2001 |
| JP | 2001277745 A | 10/2001 |
| JP | 2003159779 A | 6/2003 |
| WO | 2010007656 A1 | 1/2010 |

OTHER PUBLICATIONS

International Search Report and Written Opinion for Application No. PCT/CN2018/089217, dated Sep. 4, 2018, 11 Pages.

* cited by examiner

(12) United States Patent

SCREEN PLATE, PACKAGING METHOD, DISPLAY PANEL AND DISPLAY DEVICE

CROSS-REFERENCE TO RELATED APPLICATION

This application claims a priority to Chinese Patent Application No. 201710646231.3 filed on Aug. 1, 2017, the disclosure of which is incorporated in its entirety by reference herein.

TECHNICAL FIELD

The present disclosure relates to the field of display technology, in particular to a screen plate, a packaging method, a display panel and a display device.

BACKGROUND

A conventional display device, such as a TFT-LCD (Thin Film Transistor-Liquid Crystal Display) or an OLED (Organic Light Emitting Diode) display device, generally includes an upper substrate and a lower substrate. The upper substrate and the lower substrate are bonded by a packaging adhesive in a package area. At present, the packaging adhesive is generally formed on the upper or lower substrate by a screen printing technology, and the upper substrate and the lower substrate are correspondingly attached to each other. The display device, especially the OLED display device, requires a good packaging effect. The OLED display device includes an organic layer that is extremely sensitive to moisture and oxygen. If the packaging effect does not meet the requirements, the lifespan of the OLED display device will be reduced. The desired effect cannot be achieved by using the screen printing technology in related art.

SUMMARY

In view of the above, the present disclosure provides a screen plate, a packaging method, a display panel and a display device.

In a first aspect, the present disclosure provides a screen plate, which includes a frame, a mesh fixed onto the frame and a masking film arranged on the mesh. A printing area is formed in a portion of the mesh that is not masked by the masking film, at least one masking line is arranged in the printing area along edges of the masking film, and a width of each of the at least one masking line is greater than a width of each mesh line of the mesh.

Optionally, the printing area is an annular structure surrounding the masking film, and each of the at least one masking line is a closed annular structure surrounding the masking film.

Optionally, the printing area is provided with one masking line of the closed annular structure.

Optionally, the number of the at least one masking line is two, and the two masking lines are respectively located in the printing area corresponding to a left side and a right side of the masking film; or the number of the at least one masking line is four, and each of the four masking lines is located in the printing area corresponding to one of the edges of the masking film.

Optionally, a distance between the masking line and each edge of the frame corresponding to the masking line is equal to a distance between the masking line and each edge of the masking film corresponding to masking line.

In a second aspect, the present disclosure further provides a packaging method. The method includes:
providing with the screen plate as described above;
coating the printing area of the screen plate with a packaging adhesive; and
enabling the screen plate coated with the packaging adhesive to contact a first substrate to be printed, and printing the packaging adhesive onto the first substrate.

Optionally, the packaging method further includes: aligning the first substrate and a second substrate in different layers; and solidifying the packaging adhesive to form a packaging layer.

Optionally, the formed packaging layer comprises a plurality of retaining walls that are spaced from each other; and a strip-shaped groove is formed between any two adjacent retaining walls of the retaining walls.

Optionally, the strip-shaped groove is formed via each of the at least one masking line in the printing area.

In a third aspect, the present disclosure further provides a display panel, which is packaged using the method described above. The display panel includes a first substrate, a second substrate, and a packaging layer between the first substrate and the second substrate. The packaging layer is an annular structure arranged surround a display area of the display substrate. The packaging layer comprises at least two retaining walls that are spaced from each other and arranged along an edge of the display area. A strip-shaped groove is formed between any two adjacent retaining walls of the retaining walls.

Optionally, the strip-shaped groove is formed via each masking line in the printing area.

Optionally, the packaging layer comprises two retaining walls that are spaced from each other, and each of the two retaining walls that are spaced from each other is of a closed annular structure.

Optionally, a space inside the strip-shaped groove is a vacuum.

Optionally, the strip-shaped groove is filled with a water-absorbing material and a gas-absorbing material.

In a third aspect, the present disclosure further provides a display device including the display panel described above.

BRIEF DESCRIPTION OF THE DRAWINGS

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For those skilled in the art, other drawings can also be obtained according to these drawings without the inventive labor.

DETAILED DESCRIPTION

In order to make objects, technical solutions and advantages of the embodiments of the present disclosure clearer, the technical solutions of the embodiments of the present disclosure will be clearly and completely described below in conjunction with the drawings of the embodiments of the present disclosure. It is apparent that the described embodiments are a part of the embodiments of the present disclosure, and not all of them. Based on the described embodiments of the present disclosure, all other embodiments obtained by those skilled in the art fall within the scope of the present disclosure.

Figure 1:
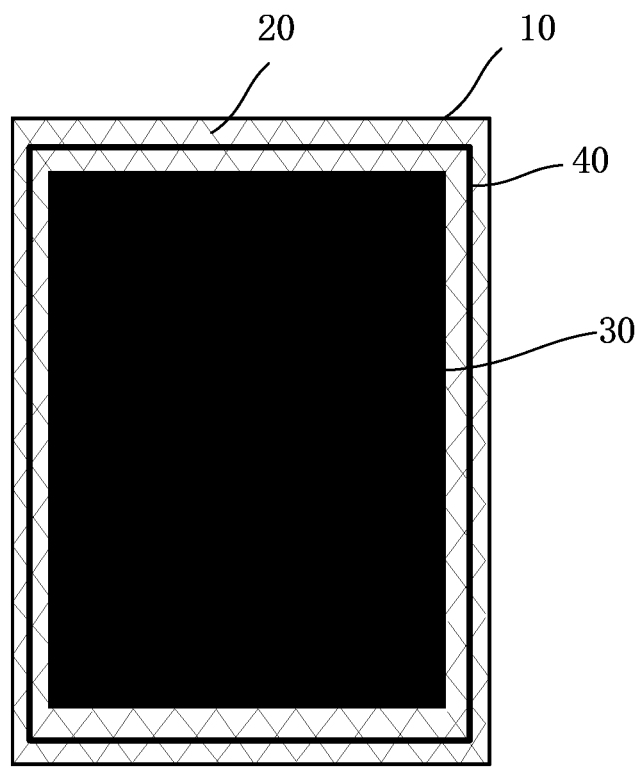
FIG. 1 is a schematic diagram showing a screen plate according to some embodiments of the present disclosure.

As shown in FIG. 1, some embodiments of the present disclosure provide a screen plate including a frame 10, a mesh 20 fixed to the frame 10, and a masking film 30 arranged on the mesh 20. A printing area is formed in a portion of the mesh 20 that is not masked by the masking film 30. A masking line 40 is arranged in the printing area. The masking line 40 is arranged along an edge of the masking film 30. A width of the masking line 40 is greater than a width of each of mesh lines of the mesh 20.

In the embodiments of the present disclosure, the printing area is an annular structure surrounding the masking film 30, and the masking line 40 is a closed annular structure surrounding the masking film 30.

In the embodiment of the present disclosure, the printing area is provided with one masking line 40 with the closed annular structure. Certainly, in some other embodiments of the present disclosure, the printing area may be provided with two or more masking lines 40 of the closed annular structure.

Figure 2:
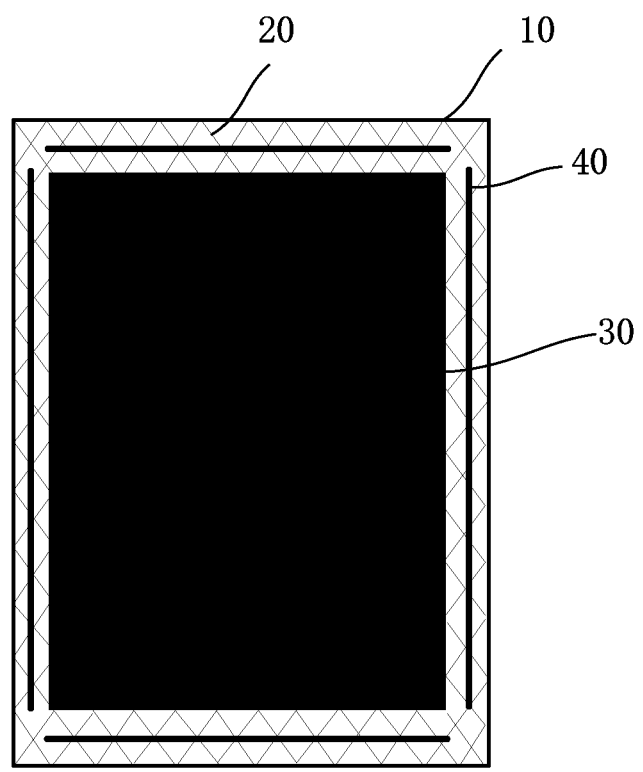
FIG. 2 is a schematic diagram showing a screen plate according to some other embodiments of the present disclosure.

In some other embodiments of the present disclosure, the masking line 40 may also not be a closed annular structure. For example, as shown in FIG. 2, the masking line 40 includes four line segments that are arranged independently to each other, and each of the line segments is arranged along the edge of the masking film 30 corresponding to the line segment. In some other embodiments of the present disclosure, the number of the line segments in the masking line 40 may be less than four. For example, only one line segment is arranged in the printing areas on each of the left and right sides of the masking film 30.

Certainly, in embodiments where the masking line 40 is not of a closed annular structure, the number of turns of the masking line 40 is not limited to one.

In the embodiments of the present disclosure, a distance between the masking line 40 and the edge of the frame 10 corresponding to the masking line 40 is equal to a distance between the masking line 40 and the edge of the masking film 30 corresponding to masking line 40. In other words, the masking line 40 is located in the middle of an annular portion of the corresponding printing area. Certainly, in some other embodiments of the present disclosure, the masking line 40 may not be arranged in the middle of the annular portion of the corresponding printing area. For example, the masking line 40 is arranged closer to the edge of the masking film 30, or is arranged closer to the edge of the frame 10 corresponding to the masking line 40.

In the embodiments of the present disclosure, the mesh 20 is of a grid structure, is formed by mesh lines and has a plurality of mesh openings. The plurality of mesh openings is used to print a material to be printed, such as the packaging adhesive, onto a substrate to be printed.

Optionally, in the embodiments of the present disclosure, the masking line 40 and the mesh lines of the mesh 20 may be made of a same material, such as a metal material.

Figure 3:
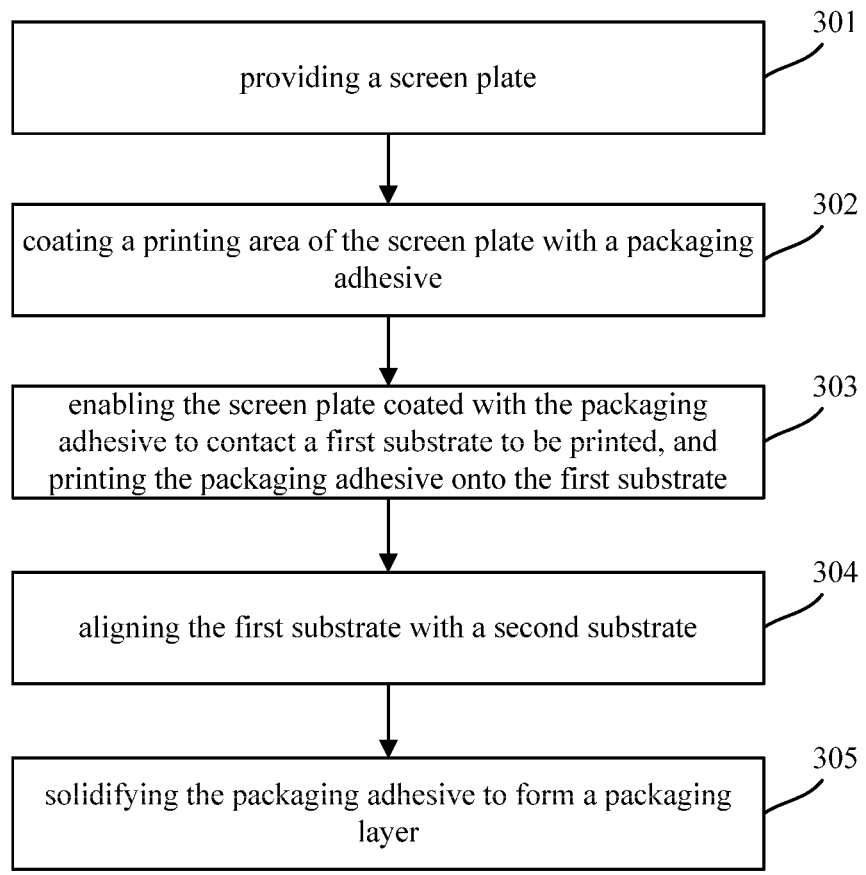
FIG. 3 is a flow chart showing a packaging method according to some embodiments of the present disclosure.

As shown in FIG. 3, some embodiments of the present disclosure further provide a packaging method, including steps 301 to 305.

Step 301: providing a screen plate, which is the screen plate in the above embodiments.

Step 302: coating the printing area of the screen plate with a packaging adhesive. The packaging adhesive may be a glass adhesive.

In some optional embodiments, the printing area of the screen plate may be coated with the packaging adhesive by a feeding scraper.

Step 303: enabling the screen plate coated with the packaging adhesive to contact a first substrate to be printed, and printing the packaging adhesive onto the first substrate.

In some optional embodiments, the screen plate may be fixed onto the to-be-printed first substrate by a fixed component of a packaging device. When preparing to print, the screen plate is coated with the packaging adhesive by the scraper so that the packaging adhesive contacts the first substrate through mesh openings of the printing area. After scraping the packaging adhesive by the scraper, the screen plate is moved down entirely, so that the packaging adhesive is printed onto the first substrate.

Step 304: aligning the first substrate with a second substrate.

Step 305: solidifying the packaging adhesive to form a packaging layer.

The way of laser irradiation may be used to solidify the packaging adhesive.

In the embodiments of the present disclosure, when the packaging adhesive is printed onto the to-be-printed substrate by using the screen plate, the packaging adhesive in the printing area corresponding to the masking line is less than the packaging adhesive in the printing area on both sides of the masking line, so that the height of the packaging adhesive in the area where the masking line is located is lower than the height of the packaging adhesive on both sides of the masking line. Thus, the packaging adhesive which has been printed has at least two retaining walls, which are respectively located on both sides of the packaging adhesive in the area where the masking line is located. At least two retaining walls may form a secondary protection or multiple protections for the display panel. Specifically, in the case that one of the retaining walls is eroded or cracked, the other retaining walls may still protect the display substrate, thereby achieving a better packaging effect and improving the resistance to erosion of the display panel.

Figure 4:
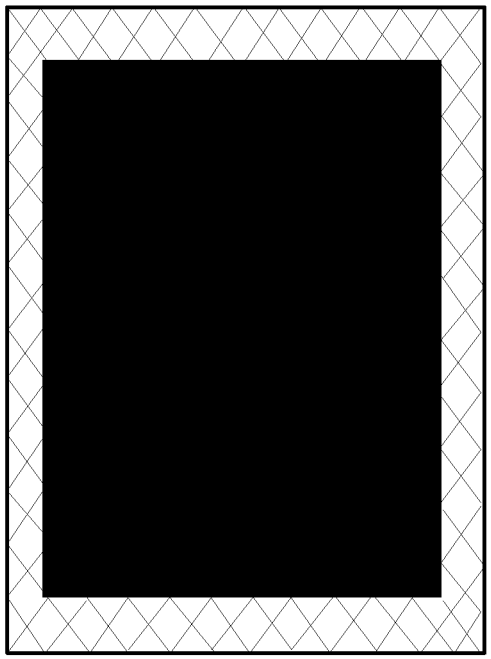
FIG. 4 is a schematic diagram showing a screen plate in the related art.
Figure 5:
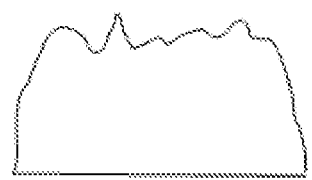
FIG. 5 is a schematic diagram showing the appearance of a packaging adhesive formed by printing the packaging adhesive by using the screen plate shown in FIG. 4.
Figure 6:
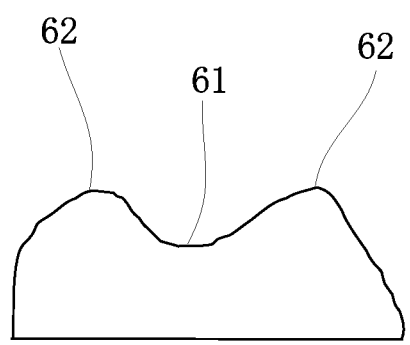
FIG. 6 is a schematic diagram showing the appearance of a packaging adhesive formed by printing the packaging adhesive by using the screen plate according to the embodiments of the present disclosure.

As shown in FIGS. 4 to 6, FIG. 4 is a schematic diagram showing a screen plate in the related art; FIG. 5 is a schematic diagram showing the appearance of a packaging adhesive formed by printing the packaging adhesive by using the screen plate as shown in FIG. 4; and FIG. 6 is a schematic diagram showing the appearance of a packaging adhesive formed by printing the packaging adhesive by using the screen plate of the embodiments of the present disclosure. It can be seen from FIG. 6 that after the packaging adhesive is printed through the screen plate according to the embodiment of the present disclosure, the appearance of the printed packaging adhesive is as follows: the height of the packaging adhesive 61 in the area where the masking line is located is lower than the height of the packaging adhesive 62 on both sides of the masking line to form the package adhesive having two retaining walls. A cross section of the packaging adhesive is of a hump-like shape. The two retaining walls may form a secondary protection for the display panel, thereby achieving a better packaging effect and improving the anti-erosion of the display panel.

Some embodiments of the present disclosure further provide a display panel which is packaged using the packaging method in the above embodiments. The display panel includes a first substrate, a second substrate, and a packaging layer between the first substrate and the second substrate. The packaging layer is an annular structure arranged surround a display area of the display panel. The packaging layer includes at least two retaining walls which are spaced from each other and arranged along an edge of the display area. A strip-shaped groove is formed between any two adjacent retaining walls.

The packaging layer corresponds to the printing area in the above method embodiments. The strip-shaped groove is formed due to the masking line 40 in the above method embodiments.

In an embodiment of the present disclosure, the packaging layer includes at least two retaining walls which are arranged along an edge of the display area and spaced from each other. Thus, the two retaining walls may form a secondary protection for the display panel, thereby achieving a better packaging effect and improving the erosion resistance of the display panel.

Optionally, in an embodiment of the present disclosure, the packaging layer includes two retaining walls which are spaced from each other. The two retaining walls which are spaced from each other respectively form two closed annular structures which may enhance the packaging effect.

In some optional embodiments of the present disclosure, the packaging layer may also include two or more retaining walls which are spaced from each other. The number of retaining walls is determined depending on the number of masking lines in the printing area in the above method embodiments.

Optionally, in an embodiment of the present disclosure, inside the strip-shaped groove is a vacuum to prevent water, gas and the like from remaining in the packaging structure, thereby further improving the erosion resistance of the display panel. In addition, laser solidifying is usually performed on the packaging adhesive under atmospheric pressure. There is a pressure difference between the strip-shaped groove and the external atmospheric pressure, so that the packaging adhesive and the display substrate may be further pressed, and the packaging adhesive and the display substrate are combined more tightly so as to improve the packaging effect.

In the embodiments of the present disclosure, the strip-shaped groove may further be filled with a water-absorbing material and a getter material. In the case that water and vapor enter the display panel through the external retaining wall, the water and vapor may be respectively absorbed by the water-absorbing material and the getter material, thereby further improving the erosion resistance of the display panel.

Some embodiments of the present disclosure further provide a display device including the above display panel.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Similarly, such terms as "a" or "one" and the like do not indicate a quantity limitation, but mean that there is at least one. Such terms as "connected" or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:
1. A screen plate, comprising:
a frame, a mesh fixed onto the frame and a masking film arranged on the mesh, wherein a printing area is formed in a portion of the mesh that is not masked by the masking film, at least one masking line is arranged in the printing area along edges of the masking film, and a width of each of the at least one masking line is greater than a width of each mesh line of the mesh.
2. The screen plate according to claim 1, wherein
the printing area is an annular structure surrounding the masking film, and each of the at least one masking line is a closed annular structure surrounding the masking film.
3. The screen plate according to claim 2, wherein
the printing area is provided with one masking line of the closed annular structure.
4. The screen plate according to claim 1, wherein
the number of the at least one masking line is two, and the two masking lines are respectively located in the printing area corresponding to a left side and a right side of the masking film; or
the number of the at least one masking line is four, and each of the four masking lines is located in the printing area corresponding to one of the edges of the masking film.
5. The screen plate according to claim 1, wherein
a distance between the masking line and each edge of the frame corresponding to the masking line is equal to a distance between the masking line and each edge of the masking film corresponding to masking line.
6. A packaging method, comprising
providing with a screen plate, wherein the screen plate comprises a frame, a mesh fixed onto the frame and a masking film arranged on the mesh, a printing area is formed in a portion of the mesh that is not masked by the masking film, at least one masking line is arranged in the printing area along edges of the masking film, and a width of each of the at least one masking line is greater than a width of each mesh line of the mesh;
coating the printing area of the screen plate with a packaging adhesive; and
enabling the screen plate coated with the packaging adhesive to contact a first substrate to be printed, and printing the packaging adhesive onto the first substrate.
7. The packaging method according to claim 6, further comprising:
aligning the first substrate and a second substrate in different layers; and
solidifying the packaging adhesive to form a packaging layer.

8. The packaging method according to claim 7, wherein the formed packaging layer comprises a plurality of retaining walls that are spaced from each other; and a strip-shaped groove is formed between any two adjacent retaining walls of the retaining walls.

9. The packaging method according to claim 8, wherein the strip-shaped groove is formed via each of the at least one masking line in the printing area.

10. The packaging method according to claim 6, wherein the printing area is an annular structure surrounding the masking film, and each of the at least one masking line is a closed annular structure surrounding the masking film.

11. The packaging method according to claim 10, wherein the printing area is provided with one masking line of the closed annular structure.

12. The packaging method according to claim 6, wherein the number of the at least one masking line is two, and the two masking lines are respectively located in the printing area corresponding to a left side and a right side of the masking film; or the number of the at least one masking line is four, and each of the four masking lines is located in the printing area corresponding to one of the edges of the masking film.

13. The packaging method according to claim 6, wherein a distance between the masking line and each edge of the frame corresponding to the masking line is equal to a distance between the masking line and each edge of the masking film corresponding to masking line.

14. A display panel, comprising:

a first substrate, a second substrate, and a packaging layer between the first substrate and the second substrate, wherein the packaging layer is an annular structure arranged surrounding a display area of the display panel; the packaging layer comprises at least two retaining walls that are spaced from each other and arranged along an edge of the display area; and a strip-shaped groove is formed between any two adjacent retaining walls of the retaining walls, wherein the packaging layer is formed from a packaging adhesive by using a screen plate, the packaging adhesive shaped by the screen plate is printed on the first substrate, the screen plate comprises a frame, a mesh fixed onto the frame and a masking film arranged on the mesh, a printing area is formed in a portion of the mesh that is not masked by the masking film, at least one masking line is arranged in the printing area along edges of the masking film, and a width of each of the at least one masking line is greater than a width of each mesh line of the mesh.

15. The display panel according to claim 14, wherein the strip-shaped groove is formed via each masking line in the printing area.

16. The display panel according to claim 14, wherein the packaging layer comprises two retaining walls that are spaced from each other, and each of the two retaining walls that are spaced from each other is of a closed annular structure.

17. The display panel according to claim 14, wherein a space inside the strip-shaped groove is a vacuum.

18. The display panel according to claim 14, wherein the strip-shaped groove is filled with a water-absorbing material and a gas-absorbing material.

19. A display device, comprising the display panel according to claim 14.

* * * * *

UNITED STATES PATENT AND TRADEMARK OFFICE
CERTIFICATE OF CORRECTION

| | | |
|---|---|---|
| PATENT NO. | : 10,749,145 B2 | Page 1 of 1 |
| APPLICATION NO. | : 16/335905 | |
| DATED | : August 18, 2020 | |
| INVENTOR(S) | : Xuefei Bai | |

It is certified that error appears in the above-identified patent and that said Letters Patent is hereby corrected as shown below:

On the Title Page

Item (73) Delete:
"(73) Assignees: ORDOS YUANGSHENG OPTOELECTRONICS CO., LTD., Ordos, Inner Mongolia (CN); BOE TECHNOLOGY GROUP CO., LTD., Beijing (CN)"

And Insert:
--(73) Assignees: ORDOS YUANSHENG OPTOELECTRONICS CO., LTD., Ordos, Inner Mongolia (CN); BOE TECHNOLOGY GROUP CO., LTD., Beijing (CN)--.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*